(12) United States Patent
Arnold

(10) Patent No.: US 7,129,422 B2
(45) Date of Patent: Oct. 31, 2006

(54) EMI ABSORBING SHIELDING FOR A PRINTED CIRCUIT BOARD

(75) Inventor: Rocky R. Arnold, San Carlos, CA (US)

(73) Assignee: WaveZero, Inc., Sunnyvale, CA (US)

( * ) Notice: Subject to any disclaimer, the term of this patent is extended or adjusted under 35 U.S.C. 154(b) by 0 days.

(21) Appl. No.: 10/871,874

(22) Filed: Jun. 18, 2004

(65) Prior Publication Data
US 2005/0045358 A1    Mar. 3, 2005

Related U.S. Application Data

(60) Provisional application No. 60/479,460, filed on Jun. 19, 2003.

(51) Int. Cl.
*H05K 9/00* (2006.01)

(52) U.S. Cl. .................. 174/377; 174/388; 174/394

(58) Field of Classification Search ............. 174/35 R, 174/35 MS, 35 GC; 361/816, 818, 800
See application file for complete search history.

(56) References Cited

U.S. PATENT DOCUMENTS

| 3,982,058 | A | * | 9/1976 | Hill ............................ 174/2 |
| 5,639,989 | A | * | 6/1997 | Higgins, III ........... 174/35 MS |
| 5,703,761 | A |   | 12/1997 | Heiss |
| 5,704,117 | A |   | 1/1998 | Mok et al. |
| 6,377,475 | B1 |   | 4/2002 | Reis |
| 6,744,640 | B1 | * | 6/2004 | Reis et al. .................. 361/818 |

* cited by examiner

*Primary Examiner*—Hung V Ngo
(74) *Attorney, Agent, or Firm*—Townsend and Townsend and Crew LLP

(57) ABSTRACT

The present invention provides printed circuit boards, EMI shields, and methods that provide an EMI absorbing material and an EMI reflecting material. In one embodiment, the EMI shield comprises a shield body and an EMI absorbing material coupled to the shield body.

11 Claims, 8 Drawing Sheets

EMI ABSORBING SHIELDING FOR A PRINTED CIRCUIT BOARD

CROSS-REFERENCES TO RELATED APPLICATIONS

The present application claims benefit to U.S. Provisional Patent Application Ser. No. 60/479,460, entitled "E-field and H-field EMI shielding for the printed circuit board," filed Jun. 19, 2003, the complete disclosure of which is incorporated herein by reference.

BACKGROUND OF THE INVENTION

The present invention relates generally to EMI shielding. More specifically, the present invention relates to EMI shielding that comprises an absorbing material that is capable of absorbing electromagnetic radiation.

All electronic products emit electromagnetic radiation, generally in the range of 50 MHz. to 1 GHz., but not limited to this range especially in light of the many advances in high-speed microprocessor design and the rapidly increasing capabilities of high-speed networking and switching. The problem of emittance of electromagnetic radiation is not new to designers of electronic equipment; indeed, significant efforts are taken to reduce electromagnetic interference (EMI) and electromagnetic radiation (EMR) and virtually every country has a regulating agency (FCC in the U.S., for instance) that controls the marketing and sale of electronic equipment that do not pass stringent requirements for EMI/EMR, whether radiation or intercepted (also called susceptibility) by an electronic device.

Present day solutions typically involve the use of conductively painted plastic housings, conductive gaskets, and/or metal cans that are affixed to a printed circuit board by soldering or similar methods, some of which are semi-permanent. In virtually all cases, the existing solutions are expensive and add to the cost of manufacturing electronic equipment such as cell phones, personal digital assistants, laptop computers, set-top boxes, cable modems, networking equipment including switches, bridges, and cross-connects.

More recently, technology for the metallization of polymer substrates has been in evidence. For example, Koskenmaki (U.S. Pat. No. 5,028,490) provides a polymer substrate that is layered with aluminum fibers and sintered to form a flat material with a metal layer that is intended to provide EMI control (also a legal requirement of the FCC and other foreign entities and generally referred to as electromagnetic compliance or EMC). This product was manufactured and sold by the 3-M Corporation. As of approximately 2002, this product was withdrawn from the market. The material was shown to be expensive, difficult to use, and subject to inferior performance due to cracking of the metallized layer.

Gabower (U.S. Pat. No. 5,811,050) has provided an alternative approach wherein a thermoformable substrate (any number of different kinds of polymers) is first formed, and then metallized. This approach offers the advantage of not subjecting the metallized layer to the stresses created during molding. The product has been shown to be highly effective and relatively low-cost.

The major methods of providing for a conductive coating or layer on a substrate generally include (1) selective electroless copper/nickel plating, (2) electroless plating, (3) conductive paints and inks, and (4) vacuum metallization. Collectively, these are referred to herein as "metallization methods." In each of these typical applications, either a planar or formed substrate of metal or plastic is "treated" to form a conductive shield. The ultimate quality, performance, and cost for each method varies widely but ultimate a metallized thermoformable shield is formed into an (1) integral solution that surrounds the printed circuit board in some manner (a.k.a., "enclosure" level solution), or (2) formed into a compartmentalized shield that fits on the guard traces of the PCB ("board" level solution), or (3) formed into smaller shields that fit over individual components using the guard traces ("component" level solution).

When it comes to EMI shielding at the board of component level, the feature deployed today is to place a conductive surface of the EMI shielding in contact with the guard traces either (1) directly by metallizing a shield surface and placing it in contact with the trace or (2) by metallizing the "outside" surface (from the perspective of the component being shielded) and then using some method of attachment that connects the guard trace with the metallized outside surface. The purpose of the guard traces, based upon the historical use of soldered metal cans, is to provide a point of contact between the EMI shielding and the PCB that can be subject to standardized surface mount technology (SMT) solder reflow processes that ultimately provide a solid connection between the metal can shield and the PCB. And, while the metal can and guard trace become grounded at least one point to the signal, power, or ground plane(s), the amount of peripheral contact between the shield and metal can is largely for the purpose of achieving a tight mechanical seam.

The resultant assembly of the EMI shielding and the electronic component provides adequate shielding for many applications; however, as the frequency of chips increase and the data transmission rates increase, the creation of errant radiation (EMI) becomes much easier and more harmful to circuits and components located nearby. Indeed, with the increasing density of chips, the subject of immunity (of one chip relative to another) becomes all the more important. Thus, in general, conventional EMI solutions will increasingly find themselves inadequate for purposes of immunity and indeed, radiated emissions may also become an increasing issue. Furthermore, for microwave devices, especially those that operate of have harmonic frequencies above about 10 GHz. radiated emissions will be a significant concern.

The radiation fields within an inner space defined by a printed circuit board and an EMI shield are comprised of very complex combinations of both electric fields (E-fields) and magnetic fields (H-fields) that are bouncing off chip and shield structures forming very complex fields with many resonances. These resonances can be very strong in terms of field strength and can easily be observed at frequencies that are troublesome from an EMC perspective. In general, there is nothing to contain the radiation escaping from the bottom of the chip except for the phenomena of reflection from the ground plane (the "image" plane) which can, in some situation, improve the radiation emissions problem but is problematical from a design and manufacturing point to achieve.

While electromagnetic radiation (EMR) fields are very complex, the behavior of EMI shielding can be determined from a measurement of shielding effectiveness (SE). Typically, this is done in the far field where the EMR fields are distinctly plane wave in form. In the near field, EMR is either reflected or absorbed and for the most part, with the drive for lightweight devices and shielding, reflection has been the only viable method of shielding. Controlling EMR is then a matter of designing either solid or intermittent shielding around the chip that increases the SE.

A phenomenon that may limit the effectiveness of EMI shielding structures is often referred to as cavity or enclosure resonances—the tendency of enclosed spaces with reflective surfaces to develop standing waves of varying amplitudes. It is not unusual for the peaks of the standing waves to exceed limits for radiated emissions. The wavelength of these resonances in a simplified sense is a function of a half wavelength, the dimensions of the structure and its configuration (square, rectangle, circle, etc.) with a constraint involving whole numbers of half wavelengths. In real situations, these cavity resonances are detuned (shifted in frequency and reduced in amplitude) from theory by the presence of intermediate or internal structures (i.e., chips and electronic components). In general, only sophisticated numerical analysis codes can predict these resonances. More importantly, there are not any readily acceptable methods to altering the frequency of the resonances or their amplitudes.

The presence of these difficult-to-treat resonances makes EMC design difficult. Therefore, what are needed are methods and EMI shielding that can absorb resonances within the EMI shielding.

BRIEF SUMMARY OF THE INVENTION

The present invention provides EMI shielding, shielded circuit boards, shielded electronic devices and methods of shielding a printed circuit board.

In one aspect, the present invention provides an EMI shield. The EMI shield comprises a shield body and an EMI absorbing material coupled to the shield body. The EMI shield provides both EMI reflective and EMI absorbing properties.

The shield body may be comprised of one or more layers of an insulative substrate, such as a thermoformable resin or polymer substrate. A conductive layer, such as a metal layer, may optionally be coupled to or otherwise applied to the polymer substrate. In alternative embodiments, the insulative substrate may be impregnated or otherwise treated to make the substrate conductive and no additional conductive layer is needed.

The conductive layer will be grounded and may have a thickness and resistivity that is sufficient to substantially reflect EMI. The conductive layer typically has an average thickness between about 1.0 microns and about 50.0 microns. In some configurations, the conductive layer will have a surface resistivity between about 0.01 ohms per square and about 3 ohms per square. In other embodiments, the conductive layer may have a higher surface resistivity, if desired.

In one embodiment, the shield body comprises a first layer and the EMI absorbing material is coupled to the first layer. The first layer typically includes the polymer substrate and the conductive layer, but it may only include a polymer substrate (conductive or non-conductive). In other embodiments, the shield body comprises a first layer and a second layer and the EMI absorbing material is positioned in between the first layer and the second layer. In yet other embodiments, a protective polymer layer may be applied over the conductive layer to physically separate the conductive layer and the EMI absorbing layer. In such embodiments, the conductive layer and the EMI absorbing layer may still be electrically coupled to each other, if desired.

The ability of the EMI absorbing material to absorb electromagnetic energy is based in part on the permittivity and permeability of the materials used in both the conductive layer, substrate and EMI absorbing material. Furthermore, conductive materials with a higher resistivity, which can dissipate electromagnetic energy into heat, have proven to be effective in absorbing electromagnetic energy. Materials such as the Mu-metal, stainless steel, nickel and other fabricated alloys are known to have the ability to absorb magnetic fields. Other materials while less appropriate for absorbing magnetic energy, nevertheless have the ability to reflect and alter the physical location of energy within a confined space. Applicants have found that the EMI absorbing materials of the present invention are able to absorb electric fields and magnetic fields between about 100 Khz. and about 3 GHz., or more.

In some embodiments, the EMI absorbing material may take the form of a highly resistive conductive layer (e.g., steel, aluminum, copper, etc.), a high permittivity and permeability such as Mu-metal, a carbon felt, and at least partially conductive or metallized reticulated foam structure, or the like.

In embodiments that use a high resistivity conductive layer to dissipate the H-fields, EMI absorbing material will have a higher resistivity than the conductive layer. The volume resistivity of the high resistivity conductive layer is typically between about 50 ohms and about 500 ohms. Alternatively, it may have a surface resistivity of between about 50 ohms per square and about 500 ohms per square. In other embodiments, the EMI absorbing materials may have a higher or lower resistivity. For example, in the embodiments which rely on a high permittivity and a high permeability (which is higher than the conductive layer), such EMI absorbing materials do not have to require such high resistivity levels.

In one embodiment, the EMI absorbing material has an open-celled skeletal structure that is at least partially conductive. The open celled skeletal structure typically has a conductive layer (e.g., metal layer) over at least a portion of the open-celled skeletal structure. As can be appreciated, instead of a metal layer over the open-celled skeletal structure, the open-celled skeletal structure itself may be composed of a conductive material. The EMI absorbing material may be conductive throughout, conductive along only some surfaces, or conductive only along a portion of the material.

In preferred embodiments, the EMI absorbing material comprises an open-celled skeletal structure that is composed of reticulated foam. The reticulated foam may have a variety of different pores per inch, but is typically between about 10 pores per inch and about 80 pores per inch. The reticulated foam may have differing pores per inch along its length or the same pores per inch along its length. The reticulated foam microstructure itself may be conductive (e.g., it may be carbon loaded) or the reticulated foam may be metallized along at least one surface. The metal layer on the reticulated foam typically has an average thickness that is less than about 1 micron. Specifically, the metal layer may be between about 0.5. microns and about 0.8 microns, and more preferably between about several angstroms to less than 0.1 microns.

The EMI absorbing material may fill only a portion of a chamber defined by the shield body, or it may completely fill the chamber. In some embodiments, the EMI absorbing material is in contact with the electronic component within the chamber, and in other embodiments, the EMI absorbing material is positioned within the chamber to leave open spaces around the electronic component.

The EMI absorbing material may be grounded in a variety of ways. For example, the EMI absorbing material may be directly contacted with a ground trace, in electrical contact with one or more grounded conductive layers of the shield body, and the like.

In another aspect, the present invention provides a shielded printed circuit board. The printed circuit board comprises a substrate comprising a ground plane. An electronic component is coupled to the substrate. An EMI shield is positioned on the substrate over the electronic component and is electrically coupled to the ground plane. The EMI shield comprises a shield body and an EMI absorbing material coupled to the shield body. The EMI absorbing material comprises both EMI reflective and EMI absorbing properties.

The EMI shield is typically coupled to the ground plane through a surface ground trace. The printed circuit board may further comprise a network of vias that are in electrical communication with both the EMI shield and the ground plane. The network of vias provides an EMI shield interior of the printed circuit board.

A further understanding of the nature and advantages of the invention will become apparent by reference to the remaining portions of the specification and drawings.

DETAILED DESCRIPTION OF THE INVENTION

Figure 1:
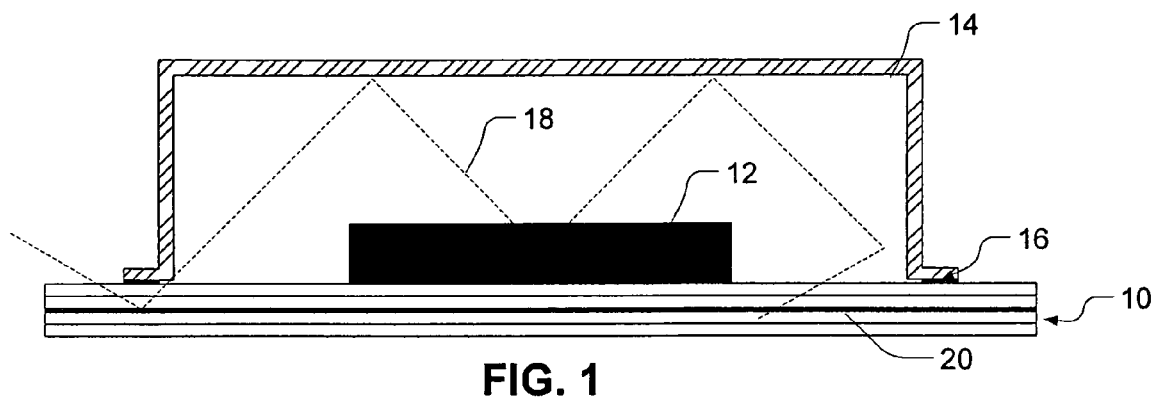
FIG. 1 illustrates a conventional method of shielding an electronic component on a printed circuit board.

The present invention provides printed circuit boards and EMI shields that comprise an integration of a shield body (e.g., a shaped resin or polymer substrate such as a metallized thermoform) with an EMI absorbing material to provide an EMI shield that is effective in terms of both reflection and absorption of electric and magnetic fields emitted from an electronic component to mitigate the effects of chamber resonances.

The EMI shields of the present invention may comprise an EMI absorbing material. The EMI absorbing material may completely fill a space defined by the shield body, cover all inner and/or outer surfaces of the shield body, or cover only selected portions of the inner and/or outer surfaces of the shield body. Further, the EMI absorbing material may be locally placed for particular applications and still provide important EMI absorption.

EMI absorbing material typically have a high permittivity and permeability (i.e., good ability to store electric and magnetic energy, respectively) and/or a high surface resistivity so as to dissipate and absorb magnetic fields within the EMI shield. The EMI absorbing material includes, but is not limited to, a magnetic or conductive metal, Mu-metal, carbon felt, an at least partially conductive or metallized reticulated foam structure, or the like.

A number of natural metals (e.g., iron, nickel, etc.) are known to have properties which allow them to absorb energy in the form of magnetic fields and these same materials have the ability to conduct electric fields. The degree to which any material offers both reflective (in the sense of E-field management) and absorptive (in terms of H-field or magnetic field management) depends upon the both the permittivity and permeability of the material. Indeed, through proper layering of thin films of various metals, it is entirely possible to construct specialty layers that provide a good balance of electronic and magnetic properties. A number of man-made fabricated metals (stainless steel, Mu-metal, etc.) have higher intrinsic permeability thus being useful as thin layers for the absorption of magnetic fields.

In one configuration, the EMI absorbing material is a reticulated foam that is composed of a lightweight polymeric material that has an open-celled skeletal structure. The open-celled structures may be comprised of a wide variety of polymers and the size and shape of the skeletal structure is dictated by the particular process chosen. The reticulated foam may be provided with a variety of different pores per inch, but is typically between 10 PPI and about 80 PPI.

The reticulated foam may or may not have one or more conductive or metal layers deposited on at least a portion of the open-celled skeletal structure. The reticulated foam can provide absorptive qualities either by being made of a metal, a conductive polymer material, or a polymer composite material (one in which the polymer is loaded with additional metallic particles or flakes, such as carbon). In embodiments which include a conductive layer on the reticulated foam, depending on the thickness and resistive property of the conductive layer, the conductive layer can enhance either the reflective, absorptive, or any combination thereof of the underlying foam structure.

In one embodiment, one or more conductive layers are applied to the reticulated foam. The conductive layer typically comprises aluminum, copper, nickel, silver, tin, steel, gold or the like. The conductive layers on the foam usually have a thickness less than about 1 micron, and preferably between about 0.5 microns and about 0.8 microns, and more preferably between about several angstroms to less than 0.1 microns, on the structure throughout the desired portion of the open-celled skeletal structure. In some, but not all embodiments, the conductive layer on the reticulated foam has a surface resistance between about 50 ohms per square and about 500 ohms per square.

The open-celled skeletal structure may be metallized along one or more surfaces. For example, the open-celled skeletal structure may be metallized throughout the structure so as to maintain electrical continuity through the open celled skeletal structure. In other embodiments, the open celled skeletal structure may be metallized along all interior and exterior surfaces except one exterior surface that is intended to contact a printed circuit board, traces, or an electronic component. In some configurations, the open celled skeletal structure may be comprised of a conductive material or the polymer skeletal structure may include conductive particles or fibers integrally formed in the polymeric microstructure and thus may not need a metal layer.

Reticulated foam can be easily cut into various shapes and formed through various types of molding processes to form to the interior shapes corresponding to the electronic components and/or shield body. The reticulated foam is typically easily compressed so that, in general, the foam can be oversized and then compressed to fit into an interior space defined by the shield body and the enclosed components. When the reticulated foam is metallized in some fashion (e.g., vacuum deposition, paint, electroless plating, electroless plating, or electroplating, for instance), the reticulated foam becomes an EMI shielding material that has both reflective properties (by virtue of the conductive material selected for coating) and absorbing properties (by virtue of the character of the polymer as in, for instance, polymer, a conductive polymer or a polymer that contains conductive particles (graphite, nickel coated particles, etc.)). A more complete description of a method of metallizing a reticulated foam is described in commonly-owned and copending U.S. patent application Ser. No. 10/230,966, entitled "EMI Air Filter," filed Aug. 28, 2002, the complete disclosure of which is incorporated herein by reference.

The EMI absorbing materials of the present invention is not limited to reticulated foam. The reticulated foam may be replaced with any similar open cell structure (either regular or irregular in geometric structure and form) and comprised of a combination of material constructions such as conductive polymer, conductive particle loaded polymer, or metal. Alternatively, other useful materials for absorbing magnetic fields or "H fields" are comprised of a carbon felt, a thin, resistive metal layer (e.g., aluminum, copper, tin. Mu-metal, etc.) typically having a thickness less than about 1 micron, or any resistive, conductive substance such as a conductive polymer (polyaniline, for instance) that can dissipate magnetic fields into heat.

FIG. 1 illustrates a shielding solution in which a PCB 10 with an emitting electronic component 12, such as a semiconductor chip, and EMI shield 14 are depicted (not to scale). The EMI shield 14 is placed on surface ground traces 16 on a first surface of the PCB through soldering or other connector assemblies that provides for electrical continuity and enclosure of the electronic component 12. Radiation 18, shown as radiating waves that, may establish standing waves within the EMI shield 14 and also "leak" out of the printed circuit board 10 through the underlying nonconductive elements of the printed circuit board structure, e.g., the PCB glass/polymer structure, as for instance, flame retardant 4 layer board—e.g., FR4. In FIG. 1, radiation 18 is shown as bouncing off an internal ground plane 20 and emerging either into the environment or adjacent to another chip (not shown). It should be appreciated that the radiation fields are comprised of very complex combinations of both electric and magnetic fields that are bouncing off electronic components and shields forming very complex fields with many resonances. These resonances can be very strong in terms of field strength and can easily be observed at frequencies that are troublesome from an EMC perspective.

Figure 1A:
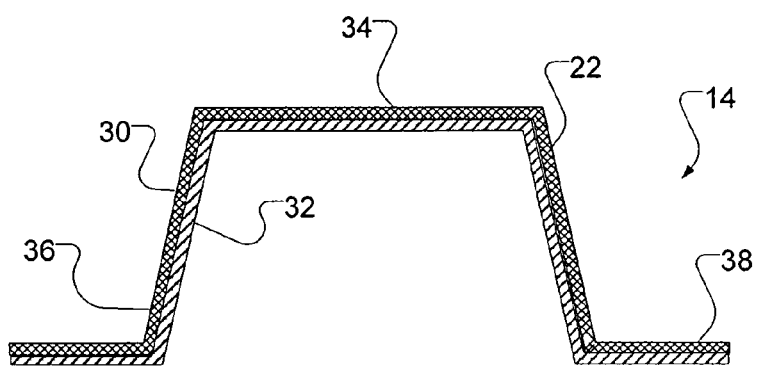
FIG. 1A illustrates one exemplary EMI shield encompassed by the present invention that includes a polymer substrate and one or more conductive layers.

FIG. 1A illustrates a simplified cross-sectional view of an EMI shield 14 that is encompassed by the present invention. EMI shield 14 may comprise one or more compartments that receive and shield the electronic component 12. In embodiments in which the EMI shield 14 has multiple compartments for multiple electronic components, each of the compartments will be sized and shaped to separate the electronic components from each other. As such, the EMI shield 14 may take on a variety of shapes, sizes and forms so as to conform to the specific shape and configuration of the printed circuit board and electronic components being shielded. The EMI shields 14 of the present invention typically include a shield body 22. The shield body 22 may be comprised of one or more layers such as a non-conductive polymer film (e.g., a thermoformable film that comprises polybutylene terephthalate, polyvinyl chloride, polycarbonate, polyethylene terephthalate, polyethylene terephthalate with Glycol, a Polycarbonate/ABS blend, or the like, extruded films that have been "loaded" with conductive particles or EMI/RFI absorbing materials (e.g., RAM or radar absorbing materials, such as used in stealth aircraft), conductive polymers, metal films, or the like.

In preferred embodiments, the shield body 22 is comprised of a polymer substrate 30 that can be formed by a variety of plastic processing methods to a desired shape to partially or fully enclose electronic component 12 on printed circuit board 10. In exemplary embodiments, the polymer substrate 30 is a thermoformable polymer that is shaped using thermoforming techniques (e.g., vacuum, pressure, or mechanical forces). The polymer substrate 30, however, may be shaped using any conventional or proprietary methods.

The shield body 22 of the EMI shield 14 typically has at least one conductive or metal layer 32 on at least one side of the polymer substrate 30. Metal layer(s) 32 will have one or more layers and has a thickness that is sufficient to block or reflect the transmission of EMI, typically between about 1 micron and about 50 microns. The metal layer may comprise one of more layers of aluminum, nickel, copper, or the like.

The metal layers 32 of the present invention may optionally be applied to the polymer substrate 30 after shaping of the resin film layer. If the metal layer 32 is applied prior to shaping of the polymer substrate 30, the shaping process (e.g., thermoforming) tends to stretch out and weaken portions of the metal layer 32. Such stretching and thinning has been found to weaken and sometimes destroy the EMI shielding capabilities of the metal layer 32. The EMI shields 14 of the present invention will generally have a substantially even thickness in the metal layer that is sufficient to block the passage of EMI. A more detailed description of some embodiments of an EMI shield that may be used with the present invention is described in commonly owned U.S. Pat. No. 5,811,050 and commonly owned U.S. patent application Ser. No. 09/788,263, entitled "EMI & RFI Shielding for Printed Circuit Boards," filed Feb. 16, 2001, U.S. patent application Ser. No. 09/947,229, entitled "Multi-Layered Structures and Methods for Manufacturing the Multi-Layered Structures," filed Sep. 4, 2001, U.S. patent application Ser. No. 09/685,969, entitled "EMI & RFI Containment Enclosure for Electronic Devices," filed Oct. 10, 2000, and PCT Patent Application No. 00/27610, entitled "EMI Containment Apparatus," filed Oct. 6, 2000, the complete disclosures of which are incorporated herein by reference.

Typically, the metal film layer 32 is deposited onto one or more surfaces of the polymer substrate 30 using vacuum metallization. While the illustrated embodiment shows a single metal layer on an inner surface of polymer substrate 30, it should be appreciated one or more metal layers may be applied to at least one of the inner surface and the outer surface of the polymer substrate 30. Vacuum metallization is one preferred method because of the substantially even layer of metal that can be applied to the shaped polymer substrate 30 to create the EMI shield 14. It should be appreciated however, that other methods of depositing the metal layer 32 to the polymer substrate 30 could be used without departing from the scope of the present invention. For example, instead of vacuum metallization, other methods such as a depositing a random mat or fiber weave, sputtering, painting, electroplating, deposition coating, electroless plating, laminated conductive layers, and the like, may be used to deposit the metal layer onto the shaped resin film layer. The metal layer 32 will typically be grounded to a ground plane 20 with a surface ground trace 16 and/or at least some of additional vias so as to create a Faraday cage around the electronic component 12.

In the simplified embodiment of EMI shield 14 shown in FIG. A, the EMI shield comprises a top surface 34 and a plurality of sidewalls 36 that extend at an angle from the top surface so as to define a chamber or inner space 26. A flange 38 may extend laterally from the plurality of side walls and extends in a plane that is substantially parallel with the first external surface 28 of printed circuit board 10. In preferred embodiments, the top surface, side walls and flange are metallized on at least one surface.

Metal cans EMI shields may be coupled to surface ground trace 16 using a solder reflow process. However, since the polymer melt temperature of the polymer substrate 30 is usually lower than the reflow temperatures, the reflow process is generally not applicable to resin based EMI shields. As such it is desirable to use non-solder connectors to couple the EMI shield 14 to the ground plane 20 in the printed circuit board 14. The connectors include, but are not limited to a conductive adhesive, removable or fixed mechanical connectors, rib and grooves, and the like. A more complete description of suitable connectors for use with the EMI shields of the present invention are described in commonly owned, copending U.S. patent application Ser. No. 10/789,176, entitled "Methods and Devices for Connecting and Grounding an EMI Shield to a Printed Circuit Board," filed Feb. 26, 2004, the complete disclosure of which is incorporated by reference.

Figure 1B:
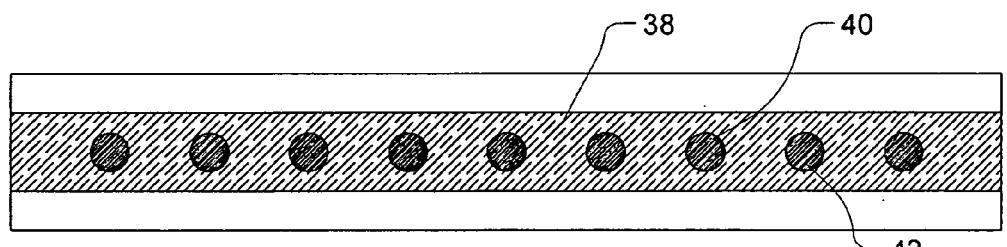
FIG. 1B is a top view of a flange of an EMI shield that has selectively spaced holes that may receive a conductive or non-conductive adhesive.

As shown in FIG. 1B, if the metallized thermoform EMI shield 14 contains a flange 38, openings 40 may optionally be selectively placed on the flange 38 where either conductive or nonconductive adhesive 42 or similar conductive material (even solder) could be placed over the openings 40 to couple a conductive portion of the flange 38 (and the EMI absorbing material) to the surface ground trace 16 and/or vias. Such a configuration is particularly beneficial when a metal layer 32 is placed on the outside surface of EMI shield 14 so that the conductive adhesive creates an electrical path to the metal layer on the outside surface of the EMI shield. The type of adhesive and its properties may be chosen to allow also for easy removal if repair of the underlying electronic circuits or components are required. One suitable adhesive is the 3M® PSA adhesive (3M part numbers 9713 and 9703).

While not illustrated, it should be appreciated that instead of selective placement of adhesive into opening 40, if desired, a substantially continuous line of adhesive may be placed onto the flange (e.g., between the flange and the printed circuit board or onto a upper surface of the flange) to mechanically and/or electrically coupled the flange to the surface ground trace 16 or other grounding elements (e.g., vias).

Figure 1C:
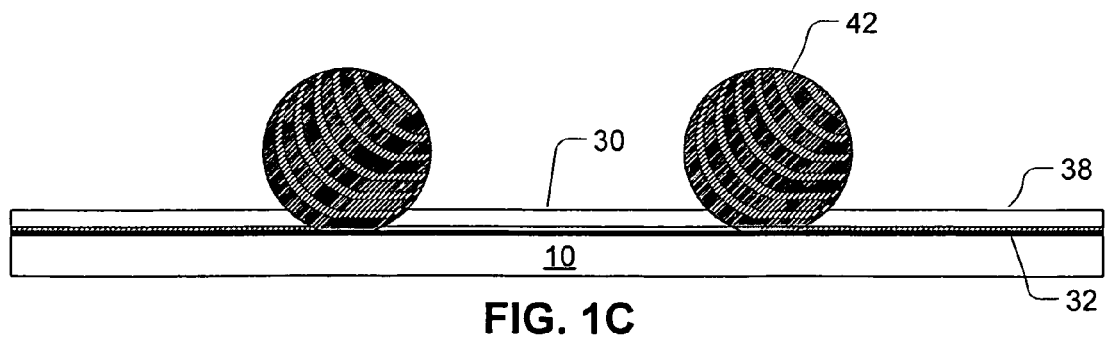
FIGS. 1C and 1D illustrate a ball of adhesive and a flattened ball of adhesive, respectively, that is positioned on a flange, and through strategically placed holes in the flange of an EMI shield of the present invention.
Figure 1D:
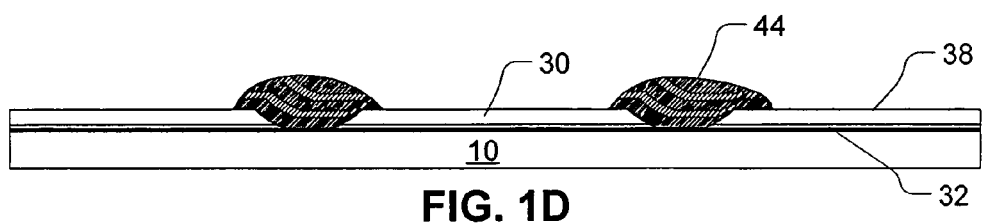

Referring now to FIGS. 1C and 1D, adhesive balls 44 may be placed either before or after the EMI shield 14 is placed onto printed circuit board 10. Thus, the adhesive balls 44 may be positioned on top of the flange 38 or between the flange 38 and printed circuit board 10. Since EMI shield 14 does not have to have a total continuous peripheral electrical contact with the vias and/or ground trace 16, either conductive or nonconductive adhesive may be used. If desired, as shown in FIG. 1D, the adhesive balls 44 may be flattened to reduce the profile of the adhesive ball. Additional methods for coupling an EMI shield to a printed circuit board can be found in commonly owned and copending U.S. patent application Ser. Nos. 10/789,176, entitled "Methods and Devices for Connecting and Grounding an EMI Shield to a Printed Circuit Board," filed Feb. 26, 2004 and 10/825,999, entitled "Electromagnetic Interference Shielding for a Printed Circuit Board," filed Apr. 15, 2004 the complete disclosures of which are incorporated herein by reference While the preferred embodiments of the present invention include a vacuum metallized thermoform shield body 22, the present invention is not limited to such EMI shields 14. For example, instead of metallized thermoforms, the present invention may use metal cans, polymer based shield with a fiber mat, injection molded plastic enclosures, and fabricated sheet metal assemblies, or the like. For ease of reference, the EMI shields 14 illustrated in FIGS. 2–7 will be shown in a simplified form as a shield body 22. It should be appreciated, that the shield body 22 may encompass any of the EMI shields 14 described herein, including a vacuum metallized thermoform EMI shield body 22 that comprises one or more metal layers 32, as illustrated in FIG. 1A.

Figure 2:
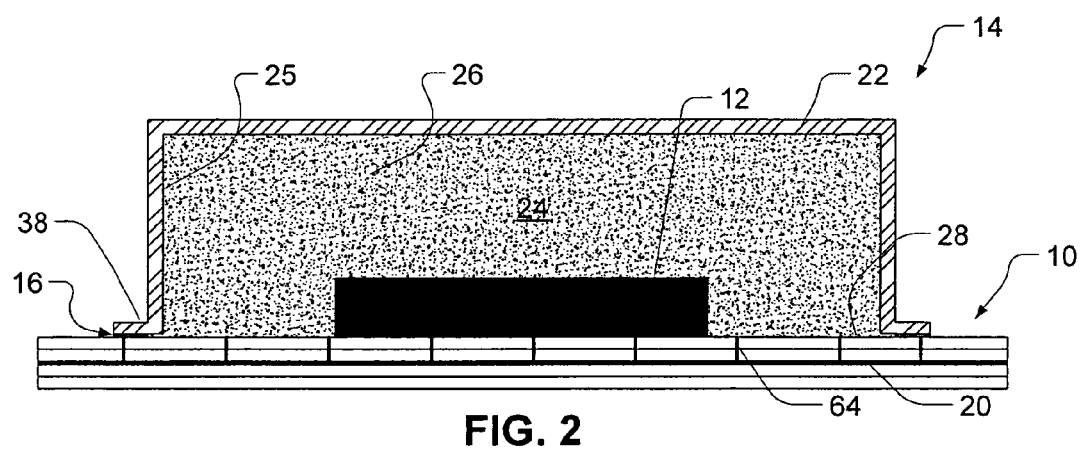
FIG. 2 illustrates a printed circuit board and an EMI shield that comprises an EMI absorbing material that completely fills an interior space of the EMI shield.

FIG. 2 shows an embodiment of an EMI shield 14 and printed circuit board 10 that are encompassed by the present invention. In the illustrated embodiment the EMI shield 14 comprises a shield body 22 that comprises at least one metal layer (not shown) and an EMI absorbing material 24 coupled to an inner surface 25 of the shield body 22. The inner surface of the shield body 22 may be the polymer substrate or it may be the one or more metal layers. In the illustrated embodiment EMI absorbing material 24 may be configured to completely fill the interior space 26 defined by the printed circuit board 10, electronic component 12 and the inner surface 25 of the shield body. In such embodiments, the surface of the printed circuit board 28 and the electronic component 12 disposed within the space 26 will be coated with an insulative layer so as to prevent shorting or interference with any leads or conductive elements exposed on the first surface of the printed circuit board.

While not shown, in most embodiments, a metal layer 32 of EMI shield 14 will be in electrical contact with the EMI absorbing material 24. For example, metal layer 32 may be disposed along an inner surface of the shield body 22 and in direct contact with the EMI absorbing material 24. As shown in FIG. 2, the metal layer (not shown) on flange 38 will also be in contact with the surface ground trace 16 so that the EMI absorbing material 24 may be electrically grounded (See also FIG. 1A). In other embodiments, the EMI shield 14 may not comprise metal layer 32, and the EMI absorbing material 24 may directly contact a grounding element, such as ground trace 16 (not shown). While FIG. 2 illustrates one method of grounding the EMI shield 14, a variety of other methods of grounding the shield body 22 and the EMI absorbing material 24 are available and are within the scope of the present invention including the application of a conductive adhesive at selected contact points, mechanical fasteners, and special features built into the containing form designed to specifically hold the interior absorbing materials.

Figure 3:
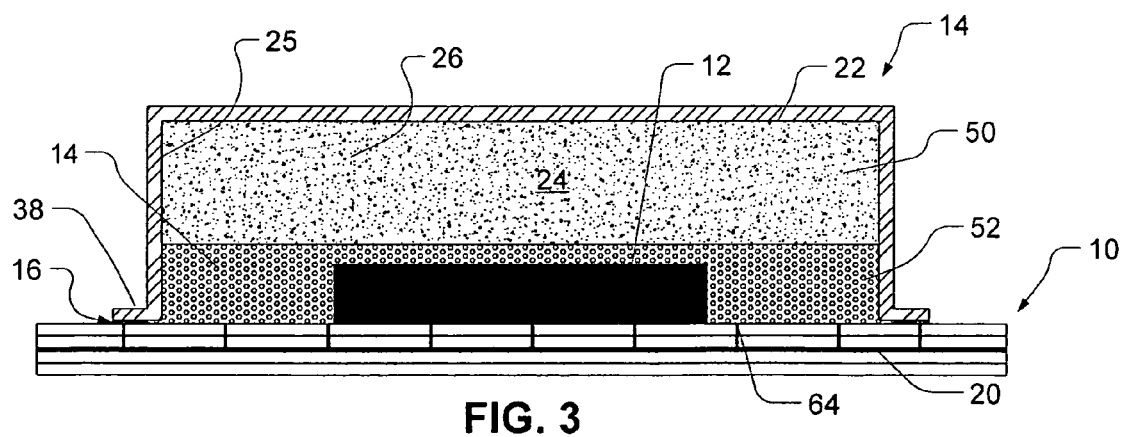
FIG. 3 illustrates a printed circuit board and an EMI shield in which a portion of the EMI absorbing material is conductively coated and a portion of the EMI absorbing material is non-conductive.

FIG. 3 illustrates an embodiment of the present invention in which the EMI absorbing material 24 within the inner space 26 is not conductive throughout its thickness. In the illustrated embodiment, a first portion 50 of the EMI absorbing material 24 is conductive (e.g., metallized) and a second portion 52 of the EMI absorbing material 24 is non-conductive. The first conductive portion 50 will typically be in contact with a conductive surface (e.g., metal layer) of the EMI shield 14 so as to be grounded. The non-conductive portion 52 may contact the traces and electronic component 12 on the printed circuit board without worry of interfering with the signals from the electronic component.

As can be appreciated, the first portion 50 and second portion 52 may be composed of a single piece of EMI absorbing material or it may be composed of a plurality of different pieces attached to each other. In one configuration, EMI absorbing material 24 is formed of a partially metallized reticulated foam. If the reticulated foam is thick enough and has high number of pores per inch (PPI) and only one side of the foam is vacuum metallized, the metal would not metallize all the way through the foam. Table I illustrates a thickness of the reticulated foam versus its pores per inch and illustrates whether or not vacuum metallization of a single side would result in a fully ("Thru") or only partially metallized ("Partial") foam.

TABLE I

Thickness of reticulated foam versus penetration

| | Penetration | | | | | |
|---|---|---|---|---|---|---|
| Thickness/PPI | 10 PPI | 18 PPI | 28 PPI | 38 PPI | 50 PPI | 80 PPI |
| .1 inches | Thru | Thru | Thru | Thru | Thru | Partial |
| .2 inches | Thru | Thru | Thru | Thru | Partial | Partial |
| .3 inches | Thru | Thru | Thru | Partial | Partial | Partial |
| .5 inches | Thru | Partial | Partial | Partial | Partial | Partial |
| 1.0 inches | Partial | Partial | Partial | Partial | Partial | Partial |

Figure 4:
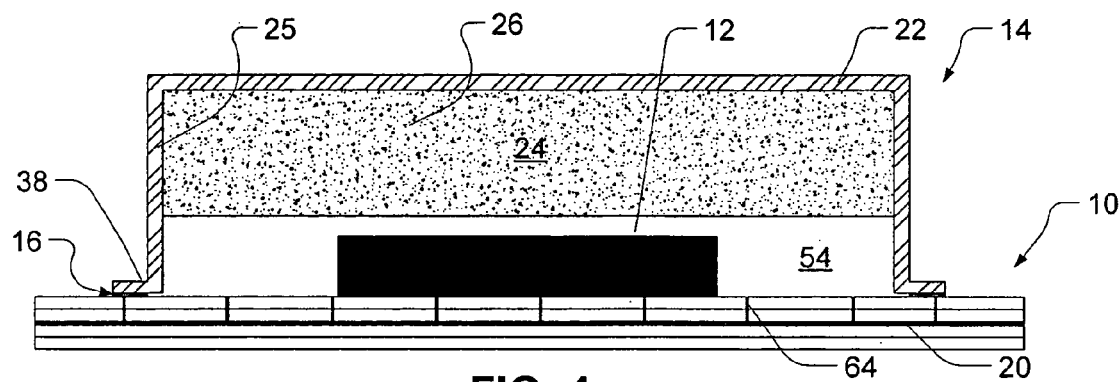
FIG. 4 illustrates a printed circuit board and an EMI shield in which the EMI absorbing material only fills a portion of the interior space of the EMI shield and does not contact the electrical component.

While the embodiment of FIG. 3 would typically fall into a category of "partial" metallized reticulated foam, it may be possible to couple a fully or partially metallized or conductive reticulated 24 to a non-metallized reticulated foam to produce the EMI absorbing material 24 illustrated in FIG. 3. In such embodiments, the first portion 50 may have the same or different PPI as the second portion 52. The first portion and second portion may be coupled using any convention method, such as an adhesive, or the like. As can be appreciated in other embodiments, two or more different portions of the reticulated foam may be coupled to each other to provide different PPI portions the density of the absorbing structures (as reflected in the parameter of PPI or pores per inch) has a strong influence on the relative amounts of reflection and absorption. Thus, the higher the PPI, the more dense the reticulated foam and there will be improved absorption and reflectance of EMI. Conversely, the lower the PPI, the larger the pores and a higher amount of frequency is allowed to pass through, and there will be lower reflection and absorption FIG. 4 illustrates another embodiment of an EMI shield 14 encompassed by the present invention in which the interior space 26 defined by the EMI shield 14 is not filled with the EMI absorbing material and the EMI absorbing material 24 does not contact the printed circuit board or the electronic component. In such embodiments, an open space 54 surrounds the electronic component 12. The EMI absorbing material 24 will typically be in contact with an inner surface 25 of the EMI shield 14 and make a grounding connection to a grounding element, such as ground trace 16, through a conductive portion of the EMI shield (e.g., a metal layer).

Figure 5:
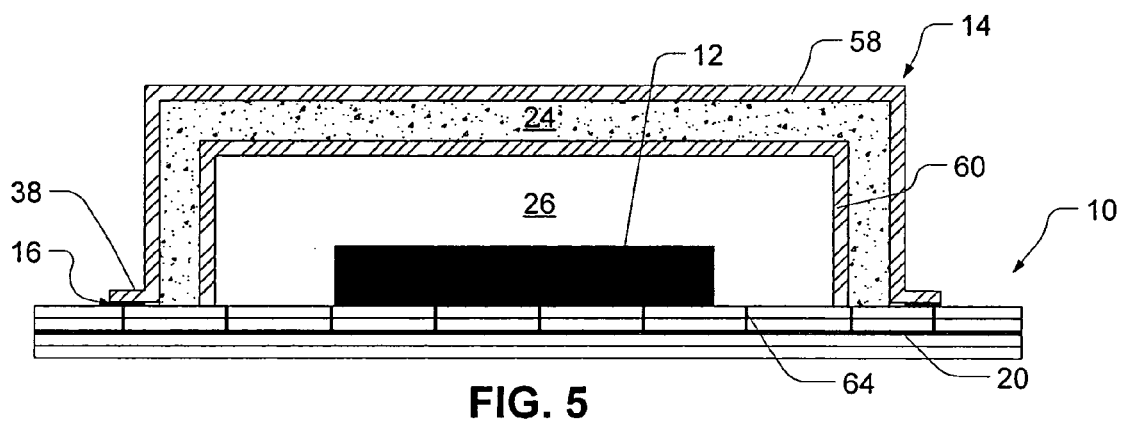
FIG. 5 illustrates an embodiment of an printed circuit board and an EMI shield which includes an EMI absorbing material positioned between a first substrate layer and a second substrate layer.

FIG. 5 shows another configuration encompassed by the present invention in which the shield body of the EMI shield 14 is comprised of a plurality of layers 58, 60. The EMI absorbing material 24 may be placed between first layer 58 and second layer 60. In embodiments in which the first layer and second layer are polymer resin layers, the first layer 58 and second layer 60 may be metallized on one or both of their surfaces (not shown). If one or both of the polymer substrate layers 58, 60 are metallized, then the one or more metal layers on the first and second layers 58, 60 may be electrically coupled to a ground plane 20 through electrical contact with a surface ground trace 16. For example, as shown in FIG. 5, a metal layer (not shown) on an inside surface of first layer 58 may be directly contacted with the ground trace 16. In the illustrated embodiment, the metal layer of first layer 58 is in electrical contact with EMI absorbing material 24, which in turn may also be in electrical contact with an optional metal layer of second layer 60.

Alternatively, one or both of first and second layers 58, 60 may be nonconductive (e.g., not metallized). If the first and second layers are not metallized, the EMI absorbing material 24 may be connected to the ground trace 16 on the printed circuit board 10 through direct contact of the EMI absorbing material 24 to a ground trace 16, or through holes 32 placed in the flanges of the EMI shielding 10 through which conductive adhesive or similar conducting coupling member is placed (See for example FIGS. 1B to 1D).

Figure 5A:
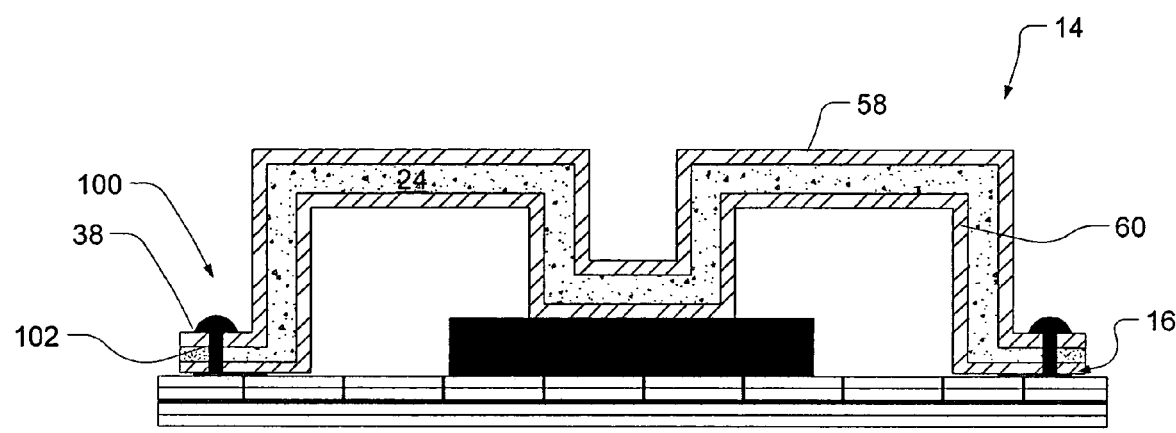
FIG. 5A illustrates a conductively filled aperture on an EMI shield that grounds an EMI absorbing material to a ground trace.

For example, in the embodiment of FIG. 5A, both the first layer 58 and the second layer 60 may comprise flanges 38 and the foam extends between the flanges 38 of the first layer 58 and second layer 60. The first layer 58 and second layer 60 may comprise a conductive layer on at least one of the surfaces. An aperture 100 may be created in the via and a conductive element 102, such as a conductive adhesive or solder may fill the via and create a conductive path between the ground trace 16 and the EMI absorbing material (and the conductive layer on the first or second layers 58, 60).

Figure 5B:
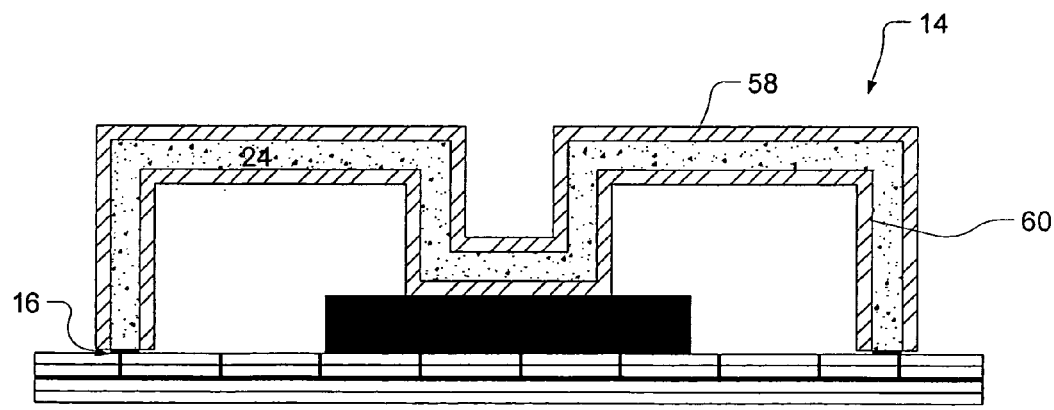
FIG. 5B illustrates a direct contact between the EMI absorbing material with a surface ground trace.

In yet another embodiment shown in FIG. 5B, the EMI absorbing material may be positioned to directly contact the ground trace. A mechanical connector may be used to couple the EMI shield 14 so that the EMI absorbing material 24 is positioned over the ground trace 16.

A more complete description of useful methods of coupling and grounding an EMI shield to a printed circuit board is described in co-pending and commonly owned U.S. patent application Ser. No. 10/789,176, filed Feb. 24, 2004, entitled "Methods and Devices for Connecting and Grounding an EMI Shield to a Printed Circuit Board" and U.S. patent application Ser. No. 10/825,999, filed Apr. 15, 2004, and entitled "Electromagnetic Interference Shielding for a Printed Circuit Board," the complete disclosures of which are incorporated herein by reference.

Figure 6:
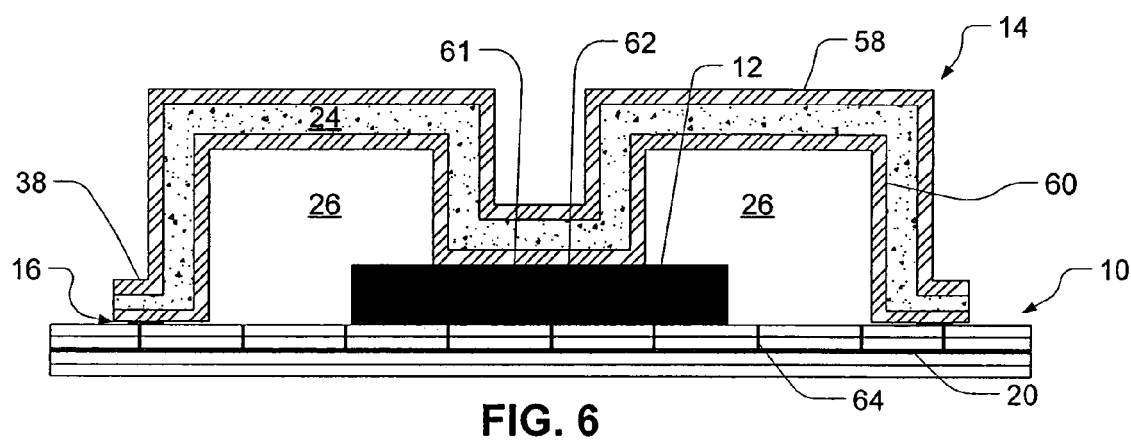
FIGS. 6 and 7 illustrate embodiments of a printed circuit board and an EMI shield that contacts a surface of the electronic component.
Figure 7:
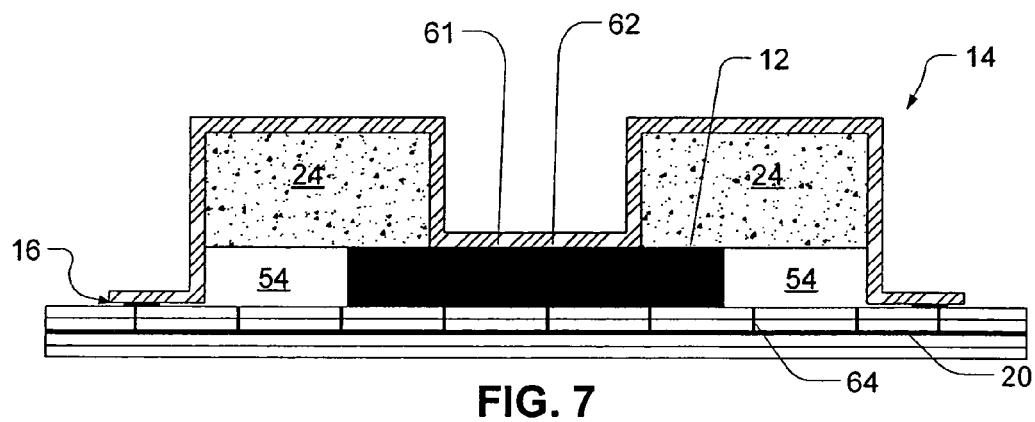

In some embodiments, the EMI shield 14 and/or reticulated foam 24 may be designed to interface with the electronic component 12, as shown in FIGS. 6 and 7. The illustrated configuration of FIGS. 6 and 7 modify and reduce the internal geometry of the internal space 26 and changes the resonances, which may prove useful in certain situations especially when harmonics are in evidence. These harmonics are difficult to control except either through geometrical modification of the containing cavity or via EMI absorbing materials. Furthermore, the electronic component 12 may optionally be modified to contain internal metallic structures or surfaces 62 that rise to the top surface of the electronic component 12 where contact is made with the EMI shield 14, thus further enhancing the overall shielding effectiveness of the EMI shield 14.

As shown in FIGS. 6 and 7, a conductive surface 61 of the EMI shield 14 may touch off onto a conductive surface 62 of electronic component 12. If the contacted surface 62 of the electronic component 12 is tied to a ground plane 20, then the contact with the conductive surface of the EMI shield provides another grounding point for the EMI shield 14. If the metal surface 61 of the EMI shield is not otherwise tied directly to a ground plane 20 (e.g., through a surface ground trace), then the electrical contact between the conductive surface 61 of the EMI shield 14 and the surface 62 of the electronic component 12 provides a more direct return path for EMI noise to the ground plane 20.

Similar to the embodiment illustrated in FIG. 5, the EMI absorbing material of FIG. 6 is positioned between a first layer 58 and a second layer 60 of the EMI shield 14. Because the absorbing material is positioned between the first layer 58 and second layer 60, any EMI noise that passes from the electronic component 12 into the EMI absorbing material may be re-reflected between the first layer 58 and second layer 60 through EMI absorbing material 24. For example, as illustrated by the three arrows in EMI absorbing material 24, EMI noise may pass from the electronic component 12 through the second layer 60 of the EMI shield and either be absorbed and returned to ground by the EMI absorbing material 24 or be reflected by an metal layer formed on the first layer 58 and reflected back into the EMI absorbing material 24 until the EMI is completely dissipated and/or returned to ground.

In any situation, a certain amount of energy is reflected leaving the remaining energy to pass through the conductive layer. The permeability and permittivity of the conductive layer dictates how much is reflected and how much is absorbed. Energy passing through the EMI absorbing material 24 will tend to physically excite the EMI absorbing material 24 thereby dissipating a portion of its energy by converting it to thermal energy or heat. The remaining energy reaching the far side of the metal conductive material can exit, albeit with much less energy, or it may be reflected back through the EMI absorbing material 24 thereby dissipating energy further. Varying the conductivity of the EMI absorbing material 24 affects the materials absorption characteristics. Most EMI absorbing materials are semi-conductive in nature. Many are carbon filled or graphite filled to promote some conductivity across the materials surface or through the volume of the material. If the absorbing material is too conductive, it may reflect more EMI noise than it absorbs, thereby negating or minizing EMI absorption through thermal conversion. Having a minimally conductive material help improve the EMI absorption capabilities of the material by providing electrically excitable particulates, such as the graphite or carbon particulates, which improves the thermal conversion of EMI noise. Similarly, by lightly metallizing (e.g., a metal layer over the open-celled skeletal structure having an average thickness between about 0.01 microns and about 0.5 microns), the foam structure becomes semi-conductive in nature and thereby performs in a similar fashion to the carbon or graphite filed materials. While it should be appreciated that the exact conductivity level or the reticulated foam material could be varied through our metalization techniques to absorb a specific EMI noise frequency range, a common volume resistivity level for reticulated foam absorbing material would be between 50 ohms and 500 ohms.

In another embodiment of the present invention shown in FIG. 7, the shield body may be comprised of only a single layer 58 and the two or more interior spaces 26, 26' defined by the substrate 58 maybe partially or completely filled with the EMI absorbing material 24. While FIG. 7 shows an open space 54 underneath the EMI absorbing material 24, any of the EMI absorbing configurations of FIGS. 2 and 3 may be provided, in which the entire interior space is filled. In such embodiments, the EMI absorbing material 24 and the shield body 22 are grounded through electrical connection to surface ground traces 16 and/or surface 62. In some applications which involve the use of nonconductive (plastic or ceramic) packaging, the EMI absorbing material 24 may be in contact with the IC and circuits. In other applications, it may be desirable to have the EMI shield 14 be comprised of a nonconducting layer contiguous with the electronic component 12. The nature of the invention is such that conductive and nonconductive surface treatments can be deployed with relative ease.

Figure 8:
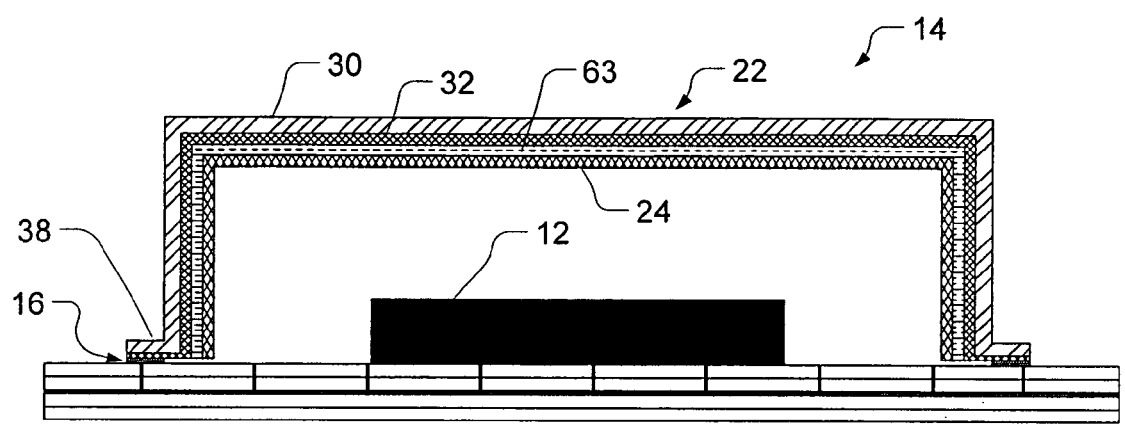
FIG. 8 illustrates an EMI shield that comprises a polymer layer between a conductive layer and an EMI absorbing material.

FIG. 8 illustrates yet another embodiment encompassed by the present invention. Similar to the previous embodiments, the EMI shield 14 shown in FIG. 8 comprises a shield body 22 that is composed of a polymer substrate 30 and a conductive layer 32. As shown in FIG. 8, the conductive layer 32 is on an inner surface of the polymer substrate and may be directly attached to the surface ground trace 16 that is positioned beneath the flange 38. Unlike the previous embodiments, a polymer layer 63 may be applied over the metal layer. The polymer layer 63 will have thickness that is less than the thickness of the polymer substrate. Typically, the polymer substrate 30 and the polymer layer 63 will be composed of different materials. For example, the polymer substrate 30 is typically a thermoform that comprises polybutylene terephthalate, polyvinyl chloride, polycarbonate, polyethylene terephthalate, polyethylene terephthalate with Glycol, a Polycarbonate/ABS blend, or the like, while the polymer layer 63 is typically sprayed onto the conductive layer 32 and is composed of polyurethane, polyethethylene, polyethethylene terephthalate, polypropylene, polyvinyl chloride, polycarbonate, polybutylene terephthalate, or the like. Polymer layer should be of sufficient thickness to prevent unwanted electrical coupling between conductive layer 32 and EMI absorbing material 24 which may diminish the absorbing properties of EMI absorbing material 24.

An EMI absorbing material 24 may be coupled to an inner surface of the polymer layer 63 so as to position the EMI absorbing material within the chamber 26 defined by the EMI shield 14. Similar to the other embodiments, the EMI absorbing material 24 will have at least one of a higher resistivity and a higher permeability and permittivity than the conductive layer 32 so that the EMI absorbing material 24 will have properties that provide for H-field absorption.

To allow for electrical coupling between the EMI absorbing material 24 and the conductive layer 32, during application of the polymer layer 63 to the conductive layer 32, a portion of the metal layer may be masked, so as to provide for an electrical path between the conductive layer 32 and the EMI absorbing material.

In some instances it may be desired to have the EMI absorbing material 24 coupled to the polymer substrate 30 instead of the conductive layer. Thus, while not shown, the position of the absorbing material 24 and the conductive layer 32 as shown in FIG. 8 may be switched.

Figure 9:
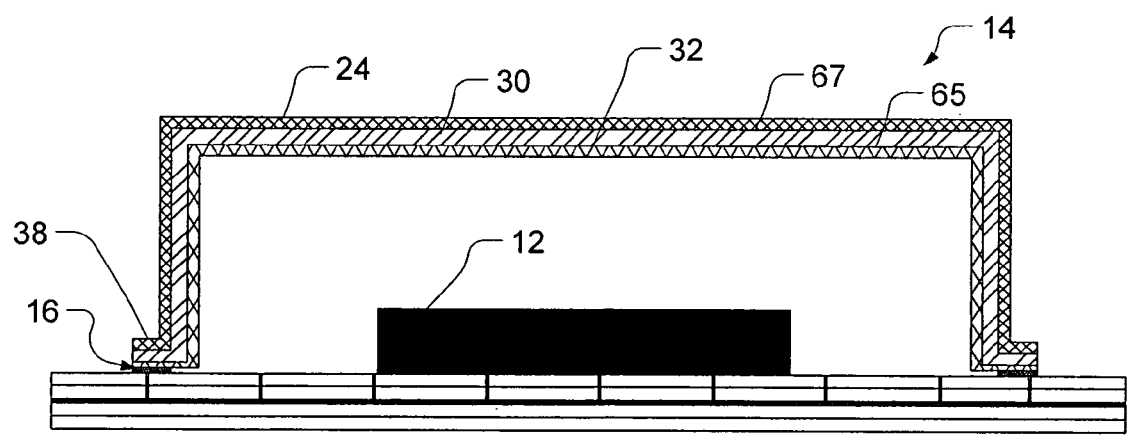
FIG. 9 illustrates a polymer substrate positioned between the conductive layer and the EMI absorbing material.

FIG. 9 illustrates yet another embodiment encompassed by the present invention. In the embodiment illustrated in FIG. 9, the polymer substrate may have a first, inner surface 65 and a second, outer surface 67. In the illustrated embodiment, the EMI reflecting conductive layer 30 is coupled to the inner surface 65 of the polymer substrate 30 and the EMI absorbing material 24 is coupled to the outer surface 67 of the polymer substrate. In other embodiments (not shown), the EMI absorbing material is coupled to the inner surface 65 and the EMI reflecting conductive surface 32 is coupled to the outer surface 67.

Similar to the other embodiments of the present invention, the EMI absorbing material 24 will have at least one of a higher resistivity and a higher permeability and permittivity than the conductive layer 32 so that the EMI absorbing material 24 will absorb H-fields.

To allow for grounding of the EMI absorbing layer and the conductive layer 32, a variety of connector members may be used. For example, in one embodiment, an opening (FIG. 1B) may be created through the flange 38 of the EMI shield 14, and a conductive element 42 may be used to mechanically and electrically couple the EMI absorbing material 24 and conductive layer 32 to the surface ground trace 16.

Figure 10:
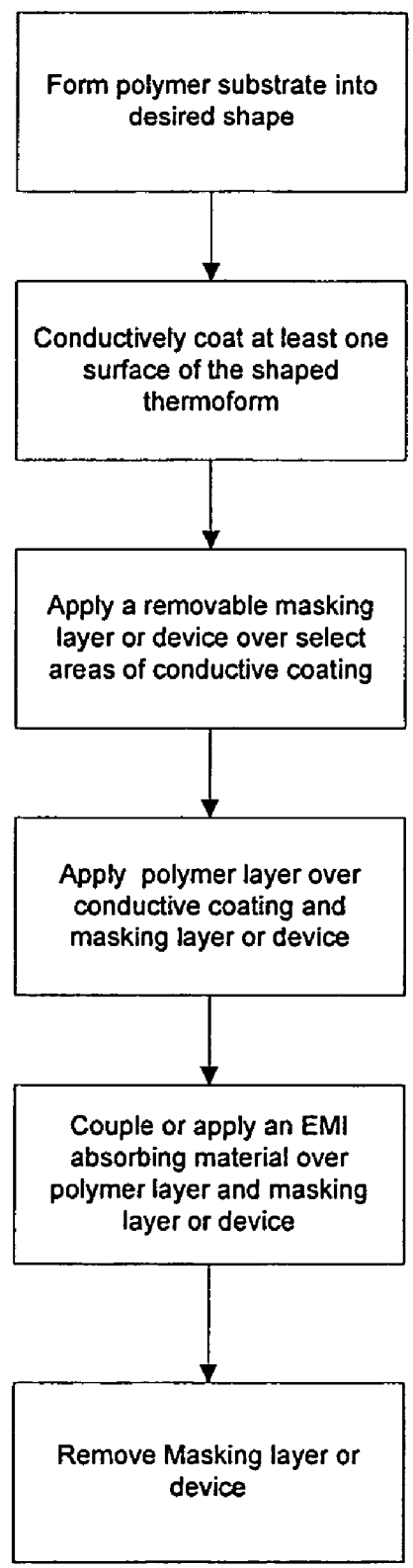
FIGS. 10 and 11 illustrate simplified methods of manufacturing various embodiments of the EMI shield of the present invention.
Figure 11:
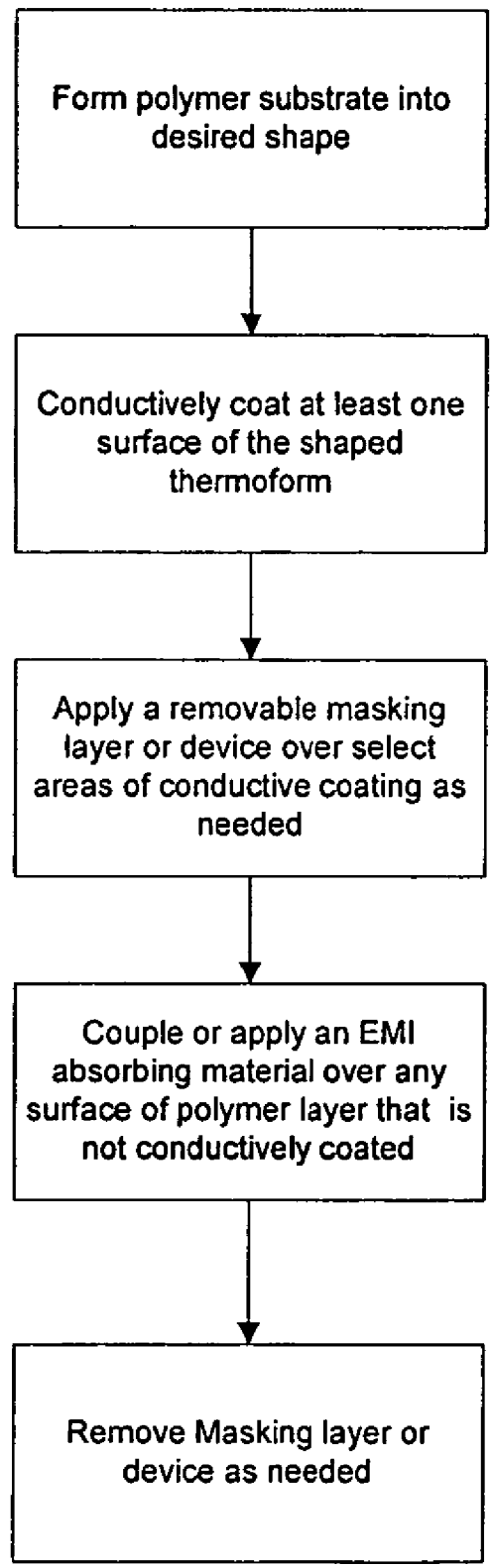

FIGS. 10 and 11 illustrate simplified methods of manufacturing various embodiments of the present invention.

Referring again to FIGS. 2–9, to improve electrical shielding within the substrate of the printed circuit board 10 a plurality of conductive elements, typically in the form of conductively coated or filled vias 64, may optionally be selectively formed in the layer(s) of the printed circuit board 10 so that at least some of vias 64 extend from a grounded layer, such as a ground plane 20 to first surface 28 of printed circuit board 10. As can be appreciated, not all of the vias 64 in printed circuit board 10 need to extend to the surface 28 of the printed circuit board 10. Moreover, some of vias 64 may be used to interconnect one grounded layer to another grounded layer, such as the ground plane 20.

Typically, vias 64 extend substantially orthogonal from a plane of the surface 28 of the printed circuit board 10 to the ground plane 20 and are formed using conventional methods. Vias 64 may be created in the layers of printed circuit board 10 so that one end of the via extends to the external surface 28 to provide a topside surface to which an electrical connection to the EMI shield 14 is possible. At least a portion of the conductive via 64 may be in contact with ground plane 20. Consequently, when an EMI shield is conductively contacted with via 64 on the first external surface 28, the EMI shield 14 will be grounded.

The network of vias 64 usually provides between as few as about four vias and as many as several hundred vias that extend from the surface 28 down to ground plane 20 around each electronic component 12. Typically, the vias 64 will be formed in a shape that corresponds to the shape of the perimeter of the flange 38 or sidewall 36 of the EMI shield 14, so as to provide a via-shield grounding contact along the perimeter of EMI shield 14. Thus, the shape of the network of via 64 and ground plane will depend on the shape of the corresponding EMI shield (e.g., if the shield perimeter is round, the vias will be positioned in a circle around the electronic component; if the shield perimeter is rectangular, then the vias 64 will be positioned in an independent rectangle around the electronic component).

The number of vias 64 utilized may be determined by the operating frequency of the electronic component or any harmonic frequencies thereof. In the case of higher operating frequencies, too few vias would potentially allow radiation to leak through in between the vias 64. At higher frequencies, wavelengths of the radiation are shorter and are able to leak out in between smaller spaces. Therefore, if there are too few vias 64, then the vias will be spaced further apart from one another and would allow for more radiation to leak through.

The number and locations of the vias 64 may be based according to the operating frequencies of the electronic components within the electronic device that is being shielded. Preferably, the vias 64 are placed a distance apart from one another that is approximately equal to between about ½ and about ¼ of the wavelength of the highest frequency or harmonic thereof to create an effective shield and prevent radiation from leaking out from between the vias 64. For example, the adjacent vias 64 may be spaced apart between about 1 mm and about 200 mm, depending on the wavelength of the highest frequency.

Typically, via 64 are plated with copper, nickel, gold, silver, tin or solder (typically tin/lead combo) and the like. Vias 64 are generally plated through an electroless or an electrolytic plating process. The plating can extend through the vias 64 and be exposed on the flat surfaces of the printed circuit board which would allow a small ringlet of the conductive surface of the via 64 to be exposed and allowed to make contact with the EMI shield or ground trace.

The diameters of vias 64 can range between 0.015" and 0.040" in some cases. The smaller the diameter of the via 64, the more expensive it typically is to manufacture the printed circuit board. In addition, if the via 64 diameter is too small, it would be difficult to conductively plate the entire depth of the via. On the other hand, if the diameter of the via 64 is too large, when solder is applied to the printed circuit board it may well up and create a bump of solder on the board, which can be undesirable. Also, if the via diameter is too big, when the non-conductive solder mask is applied, it could drape into the via 64, thereby creating a depression in the printed circuit board which may also be undesirable.

The number of the vias 64 positioned along each side of an EMI shield would depend on the operating frequency of the components being shielded. The higher the frequency, the closer the vias 64 would be placed together and therefore the more vias would be placed along each side of the shield. The height of the vias 64 is dependant on the number of layers on the printed circuit board and how many layers the via would need to pass through to reach the ground plane 20. For instance, a 4 layer printed circuit board is typically 0.064" thick total (~0.016" per layer). Vias 64 could pass between 1 layer or between all 4 layers. This same would hold true for printed circuit board with higher numbers of layers.

As shown in FIGS. 2–7, the plurality of vias 64 form an interconnected network of spaced conductive elements that extend throughout the inner structure of printed circuit board 10 to form an open, mesh-like EMI shield for the electronic component 12. When connected with an external EMI shield 14, the combination provides an EMI shield that substantially wholly surrounds a volume of the printed circuit board beneath electronic component 12 and reduces the emittance of electromagnetic radiation to surrounding electronic components. In both embodiments, the top of the EMI shielding is substantially solid (though EMI shield 14 may contain ventilation holes). While the bottom portion (e.g., the conductive vias and grounded layer) is not "solid," but is more of a mesh or cage and the spacing between the vias are small enough to substantially reduce the amount of electromagnetic interference that would escape. A more complete description of the vias may be found in commonly owned, copending U.S. patent application Ser. No. 10/825,999, entitled "Electromagnetic Interference Shielding for a Printed Circuit Board" filed on Apr. 15, 2004, the complete disclosure of which is incorporated herein by reference.

While the preferred embodiments of the present invention have been described, a person of ordinary skill in the art will recognize that various modifications, substitutions and equivalents may be used without departing from the spirit and scope of the present invention.

What is claimed is:

1. An EMI shield comprising:
   a shield body comprising a EMI reflecting conductive layer coupled to a polymer substrate;
   an EMI absorbing material coupled to the conductive layer of the shield body, the EMI absorbing material, comprising:
   a surface resistivity conductive layer that has surface resistivity higher than the conductive layer; and
   a metal layer that is disposed on an open-celled skeletal structure.

2. The EMI shield of claim 1 wherein the high surface resistivity conductive layer comprises a surface resistivity between about 50 and about 500 ohms per square and the conductive layer has a surface resistivity between about 0.01 ohms per square and about 3 ohms per square.

3. The EMI shield of claim 1 wherein the metal layer has a thickness between about 1 micron and about 50 microns, wherein the conductive layer has a thickness between about 0.01 microns and about 0.1 microns.

4. The EMI shield of claim 1 wherein the conductive open-celled skeletal structure comprises a reticulated foam or a carbon loaded reticulated foam.

5. An EMI shield comprising:
   a shield body comprising a conductive layer coupled to a polymer substrate, wherein the conductive layer has a sufficient thickness to reflect EMI;
   an EMI absorbing material electrically coupled to the conductive layer, wherein the EMI absorbing material comprises a higher permeability and permittivity than the conductive layer; and
   a substrate having an open-celled skeletal structure and a conductive metal layer deposited on at least a portion of the open-celled skeletal structure.

6. The EMI shield of claim 5 wherein the conductive open-celled skeletal structure comprises a reticulated foam, said reticulated foam further comprises a metal layer on all interior surfaces and on all exterior surfaces except a lower surface that is configured to be in contact with at least one of a printed circuit board, an electronic component, and traces on the printed circuit board.

7. The EMI shield of claim 6 wherein the reticulated foam comprises a metal layer throughout the open-celled skeletal structure so as to maintain electrical continuity throughout the substrate.

8. The EMI shield of claim 6 wherein the reticulated foam only partially fills the chamber defined by the shield body.

9. The EMI shield of claim 6 where the reticulated foam substantially fully fills the chamber defined by the shield body.

10. The EMI shield of claim 5 wherein the shield body comprises a top surface and a plurality of sidewalls that extend at an angle from the sidewalls so as to define a chamber that receives an electronic component.

11. The EMI shield of claim 5 wherein the shield body comprises an inner layer and an outer layer, wherein the EMI absorbing material is positioned between the inner layer and the outer layer.

* * * * *